(12) United States Patent
Lu et al.

(10) Patent No.: US 9,479,745 B2
(45) Date of Patent: Oct. 25, 2016

(54) COLOR FILTER ARRAY WITH REFERENCE PIXEL TO REDUCE SPECTRAL CROSSTALK

(71) Applicant: OMNIVISION TECHNOLOGIES, INC., Santa Clara, CA (US)

(72) Inventors: Chen-Wei Lu, Zhubei (TW); Jin Li, San Jose, CA (US); Yin Qian, Milpitas, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 64 days.

(21) Appl. No.: 14/491,039

(22) Filed: Sep. 19, 2014

(65) Prior Publication Data

US 2016/0088265 A1    Mar. 24, 2016

(51) Int. Cl.
  *H04N 9/04* (2006.01)
  *H01L 27/146* (2006.01)
  *G02B 5/20* (2006.01)

(52) U.S. Cl.
  CPC .............. *H04N 9/045* (2013.01); *G02B 5/201* (2013.01); *H01L 27/14621* (2013.01); *H01L 27/14627* (2013.01); *H01L 27/1464* (2013.01)

(58) Field of Classification Search
  CPC .... H04N 9/045; H04N 5/3575; H04N 5/365; H01L 27/14621; G02B 5/201
  See application file for complete search history.

(56) References Cited

U.S. PATENT DOCUMENTS

| 7,924,342 | B2 | 4/2011 | Kusaka | |
| 8,295,595 | B2 | 10/2012 | Matsushita et al. | |
| 8,350,934 | B2* | 1/2013 | Chao | H04N 5/3572 348/187 |
| 9,106,785 | B2* | 8/2015 | Maeda | H04N 9/045 |
| 2005/0057655 | A1* | 3/2005 | Duesman | H01L 21/76805 348/187 |
| 2007/0285540 | A1 | 12/2007 | Kwon et al. | |
| 2008/0180557 | A1* | 7/2008 | Egawa | H04N 9/045 348/294 |
| 2009/0108385 | A1 | 4/2009 | Dungan et al. | |
| 2011/0069210 | A1* | 3/2011 | Ogura | H04N 5/359 348/247 |
| 2011/0074989 | A1 | 3/2011 | Fossum et al. | |
| 2014/0078349 | A1* | 3/2014 | Velichko | H04N 5/359 348/241 |
| 2014/0313350 | A1* | 10/2014 | Keelan | H04N 9/045 348/188 |

FOREIGN PATENT DOCUMENTS

| JP | 2004-221838 | 8/2004 |
| JP | 2005-311455 | 11/2005 |

OTHER PUBLICATIONS

Taiwanese Patent Application No. 104127203—Office Action with English Translation, mailed Jul. 22, 2016, 14 pages.

* cited by examiner

*Primary Examiner* — Timothy J Henn
(74) *Attorney, Agent, or Firm* — Blakely Sokoloff Taylor & Zafman LLP

(57) ABSTRACT

A color filter array includes a plurality of tiled minimal repeating units, each minimal repeating unit comprising an M×N set of individual filters. Each minimal repeating unit includes a plurality of imaging filters including individual filters having at least first, second, and third photoresponses, and at least one reference filter having a reference photoresponse, wherein the reference filter is positioned among the imaging filters and wherein the reference photoresponse transmits substantially the crosstalk spectrum that is not filtered from light incident on the color filter array by the plurality of imaging filters. Other embodiments are disclosed and claimed.

11 Claims, 12 Drawing Sheets

COLOR FILTER ARRAY WITH REFERENCE PIXEL TO REDUCE SPECTRAL CROSSTALK

TECHNICAL FIELD

The disclosed embodiments relate generally to image sensors and in particular, but not exclusively, to image sensors including a color filter array including a reference pixel to reduce spectral crosstalk.

BACKGROUND

Image sensors can capture color images by combining a pixel array of photosensitive pixels with a set of color filters. Each pixel in the pixel array is coupled to a filter that removes all but a particular wavelength—that is, a particular color of light—from the light incident on the image sensor. As a result, each pixel in the pixel image captures light of a single color, and for each pixel the color values for the other colors are interpolated.

Spectral crosstalk is a problem that occurs in devices that filter separate wavelengths, as do color filters that are coupled to a pixel array in a color image sensor when a small portion of the optical power that should have ended up in a particular channel—that is, that should have been output by particular filter—actually ends up in another channel, such as an adjacent channel. In an image sensor with a color filter array, spectral crosstalk is often the result of imperfect color filtering: a blue filter, for example, might let through some red and green light, so that a pixel to which the blue filter is coupled will receive more than just the blue light it is supposed to receive. In a CMOS image sensor, crosstalk causes degradation of spatial resolution, color mixing, and image noise. This can have serious effects on the sensor's signal-to-noise ratio (SNR) and hence on the error rate of the system. In an RGB image sensor, sensitivity came can be gained by using a clear filter in the filter array, but it increases crosstalk.

Various methods have been tried to decrease spectral crosstalk, but all have drawbacks. Some other types of crosstalk can be reduced by process profile control between pixels, but spectral crosstalk is a natural material property that can't be reduced by process. Another way to reduce spectral crosstalk is to use thicker color filters; this can significantly reduce crosstalk, but it also reduces the signal strength and the quantum efficiency (QE) of the pixel. Another way to reduce spectral crosstalk is to increase pigment concentration in the filters, but the material's refractive index will increase and induce higher optical crosstalk.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF ILLUSTRATED EMBODIMENTS

Embodiments are described of an apparatus, system and method for image sensors including a color filter array with a reference pixel to reduce spectral crosstalk. Specific details are described to provide a thorough understanding of the embodiments, but one skilled in the relevant art will recognize that the invention can be practiced without one or more of the described details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

Figure 1:
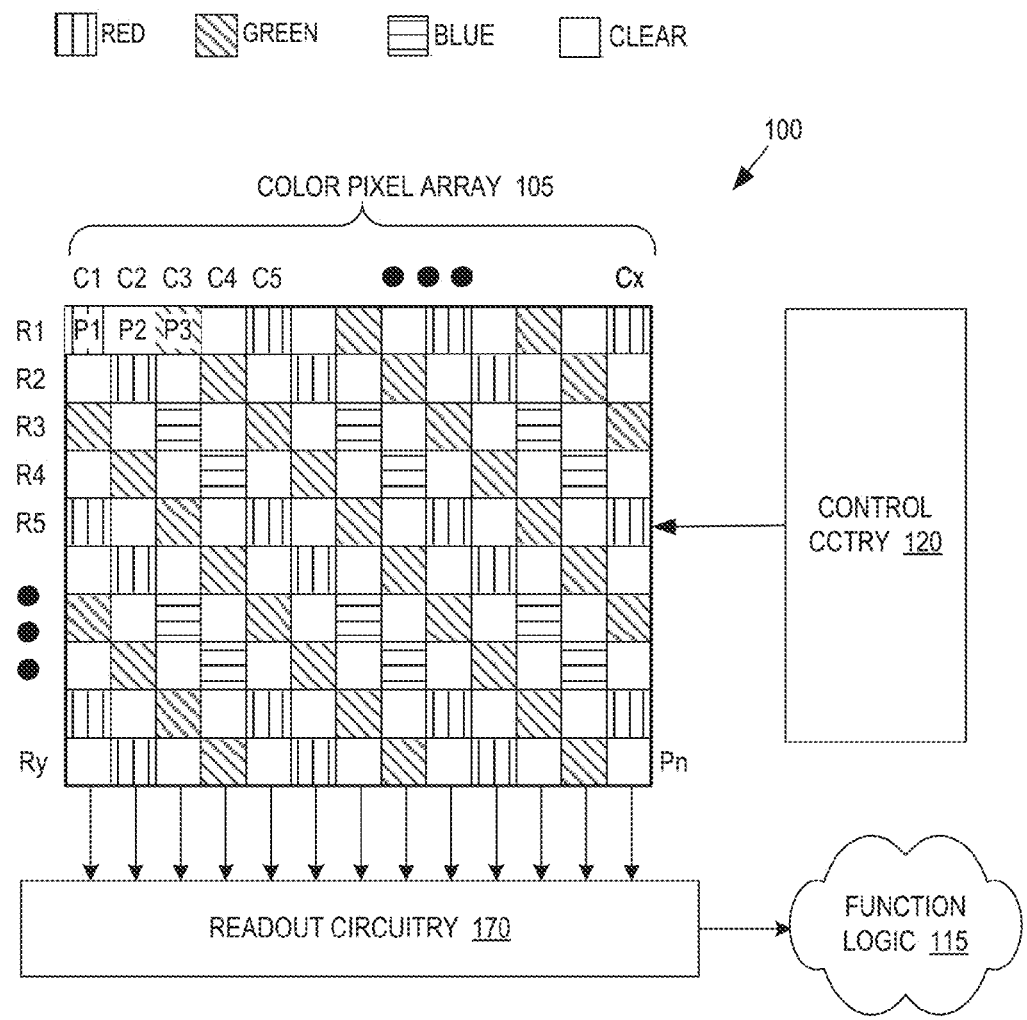
FIG. 1 is a schematic of an embodiment of an image sensor including a color filter array.
Figure 2A:
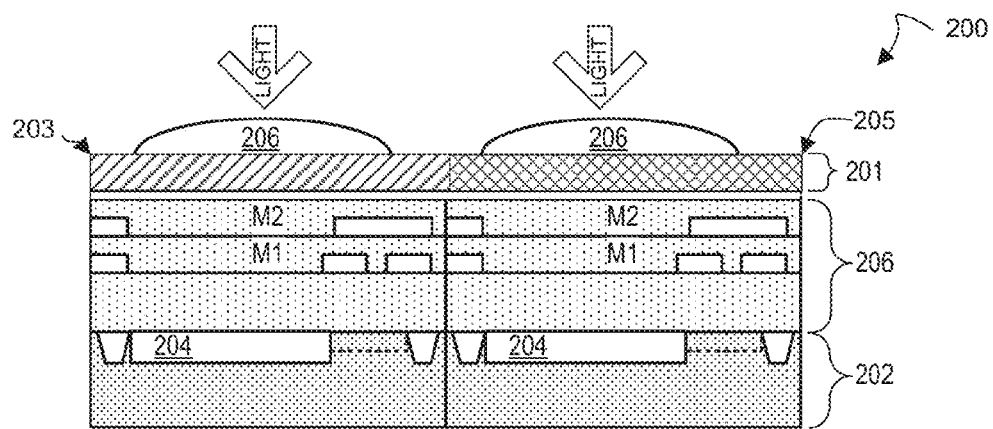
FIGS. 2A-2B are, respectively, cross-sections of embodiments of a pair of frontside illuminated pixels and embodiments of a pair of backside-illuminated pixels.
Figure 2B:
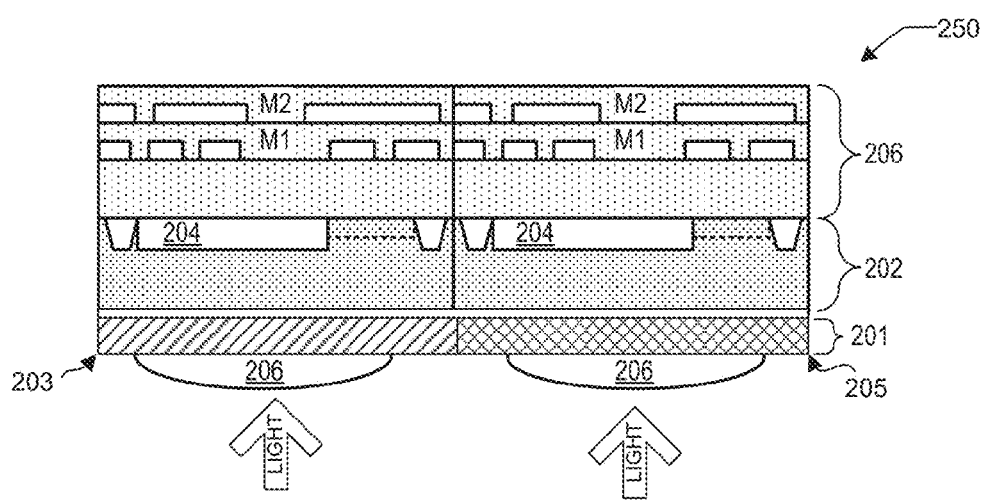

FIG. 1 illustrates an embodiment of a complementary metal oxide semiconductor (CMOS) image sensor 100 including a color pixel array 105, readout circuitry 170 coupled to the pixel array, function logic 115 coupled to the readout circuitry, and control circuitry 120 coupled to the pixel array. Color pixel array 105 can be implemented in a frontside-illuminated image sensor, as shown in FIG. 2A, or as a backside-illuminated image sensor, as shown in FIG. 2B. Color pixel array 105 is a two-dimensional (2D) array of individual imaging sensors or pixels (e.g., pixels P1, P2 . . . , Pn) arranged into X pixel columns and Y pixel rows. As illustrated, each individual pixel in the array is arranged into a row (e.g., rows R1 to Ry) and a column (e.g., column C1 to Cx) to acquire image data of a person, place, or object. The image data or pixel data can then be used to render a 2D image of the person, place, or object. Color pixel array 105, if present, assigns color to each pixel using a color filter array ("CFA") coupled to the pixel array.

After each pixel in pixel array 105 has acquired its image data or image charge, the image data is read out from the individual pixels by readout circuitry 170 and transferred to function logic 115 for storage, additional processing, etc.

Readout circuitry 170 can include amplification circuitry, analog-to-digital ("ADC") conversion circuitry, or other circuits. Function logic 115 can store the image data and/or manipulate the image data by applying post-image effects (e.g., crop, rotate, remove red eye, adjust brightness, adjust contrast, high dynamic range (HDR) image combination, or otherwise). Function logic 115 can also be used in one embodiment to process the image data to correct (i.e., reduce or remove) fixed pattern noise. Control circuitry 120 is coupled to pixel array 105 to control operational characteristic of the pixel array 105. For example, control circuitry 120 can generate a shutter signal for controlling image acquisition.

FIG. 2A illustrates a cross-section of an embodiment of a pair of frontside-illuminated (FSI) pixels 200 in a CMOS image sensor. The front side of FSI pixels 200 is the side of substrate 202 upon which the photosensitive area 204 and associated pixel circuitry are disposed, and over which metal stack 206 for redistributing signals is formed. Metal stack 206 includes metal layers M1 and M2, which are patterned to create an optical passage through which light incident on FSI pixels 200 can reach photosensitive or photodiode ("PD") regions 204. To implement a color image sensor, the front side can include color filter arrangement 201, with each of its individual color filters (individual filters 203 and 205 are illustrated in this particular cross section) disposed under a microlens 206 that aids in focusing incident light onto PD region 204.

FIG. 2B illustrates a cross-section of an embodiment of a pair of backside-illuminated (BSI) pixels 250 in a CMOS image sensor. As in FSI pixels 200, the front side of pixels 250 is the side of substrate 202 upon which the photosensitive regions 204 and associated pixel circuitry are disposed, and over which metal stack 206 is formed for redistributing signals. The backside is the side of substrate 202 opposite the front side. To implement a color image sensor, the backside can include color filter array 201, with each of its individual color filters (individual filters 203 and 205 are illustrated in this particular cross section) disposed under a microlens 206. Microlenses 206 aid in focusing incident light onto photosensitive regions 204. Backside illumination of pixels 250 means that the metal interconnect lines in metal stack 206 do not obscure the path between the object being imaged and the photosensitive regions 204, resulting in greater signal generation by photosensitive regions 204.

Figure 3A:
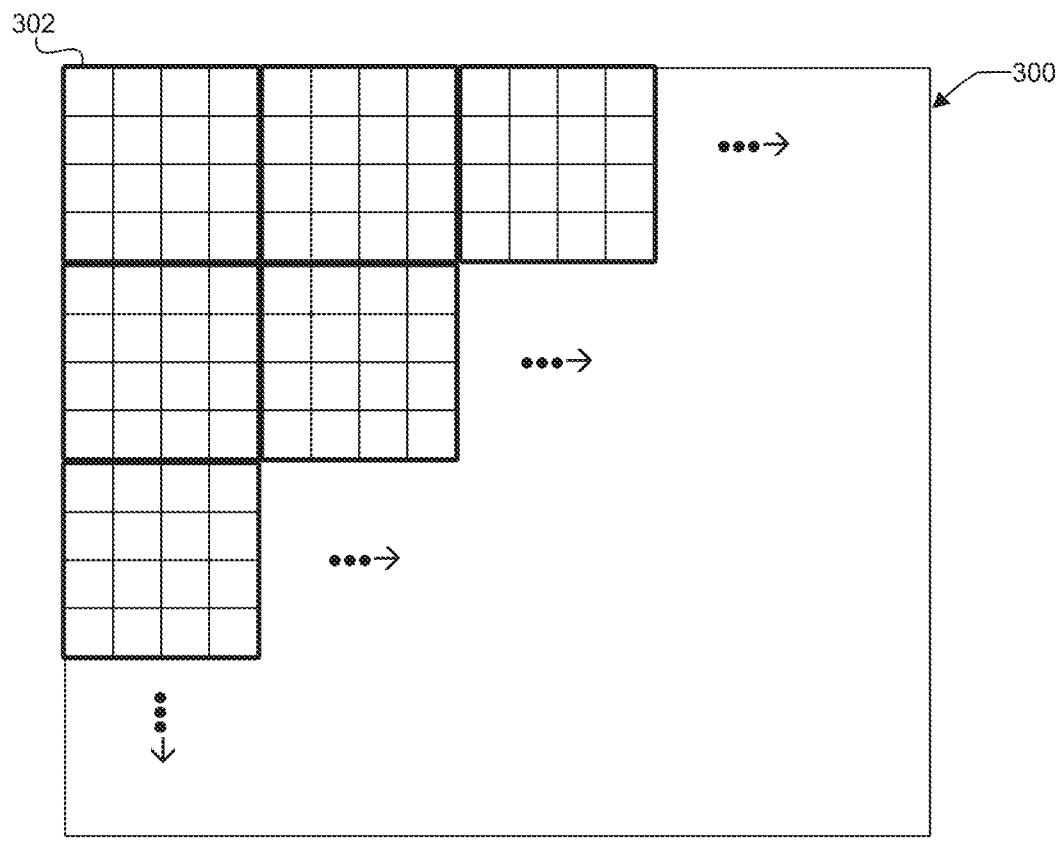
FIGS. 3A-3C are diagrams that explain the terminology used to describe embodiments of color filter arrays and minimal repeating units.
Figure 3B:
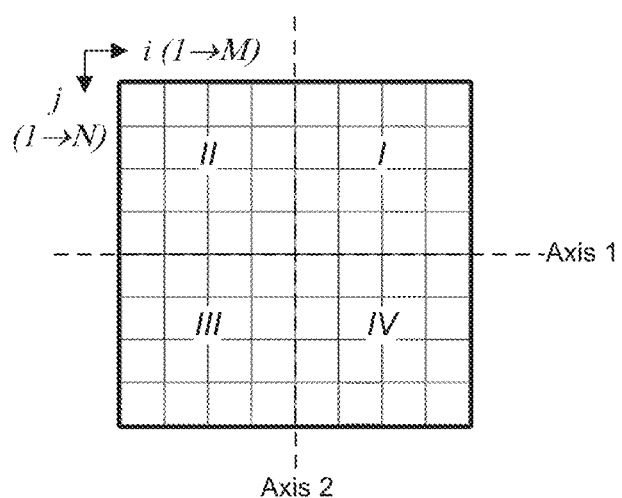
Figure 3C:
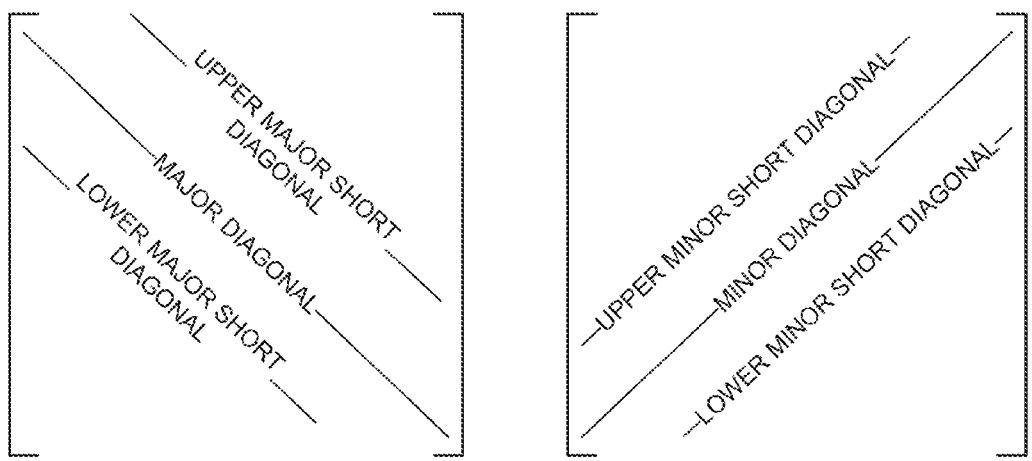

FIGS. 3A-3C illustrate terminology that will be used in the discussion of color filter arrays (CFAs) and minimal repeating units (MRUs). FIG. 3A illustrates an embodiment of a CFA 300. CFA 300 includes a number of individual filters. Each individual filter has a particular photoresponse and is optically coupled to a corresponding individual pixel in the pixel array. As a result, each pixel has a particular color photoresponse selected from a set of photoresponses. A particular photoresponse has high sensitivity to certain portions of the electromagnetic spectrum while simultaneously having low sensitivity to other portions of the spectrum. Because CFAs assign a separate photoresponse to each pixel by placing a filter over the pixel, it is common to refer to a pixel as a pixel of that particular photoresponse. Hence a pixel can be referred to as a "clear pixel" if it has no filter or is coupled to a clear (i.e., panchromatic or colorless) filter, as a "blue pixel" if it is coupled to a blue filter, as a "green pixel" if it is coupled to a green filter, or as a "red pixel" if it is coupled to a red filter, and so on.

The set of color photoresponses selected for use in a sensor usually has at least three colors but can include four or more in some embodiments. In one embodiment the set of color photoresponses can be red, green, blue, and clear or panchromatic (i.e., neutral or colorless). In other embodiments, CFA 300 can include other photoresponses in addition to, or instead of, those listed. For instance, other embodiments can include cyan (C), magenta (M), and yellow (Y) filters, clear (i.e., colorless) filters, infrared filters, ultraviolet filters, x-ray filters, etc. Other embodiments can also include a filter array with an MRU that includes a greater or lesser number of pixels than illustrated for MRU 302. As used herein, a white, clear, or panchromatic photoresponse refers to a photoresponse having a wider spectral sensitivity than those spectral sensitivities represented in the selected set of color photoresponses. A panchromatic photosensitivity can have high sensitivity across the entire visible spectrum. The term panchromatic pixel refers to a pixel with a panchromatic photoresponse. Although the panchromatic pixels generally have a wider spectral sensitivity than the set of color photoresponses, each panchromatic pixel can have an associated filter. Such filter can be either a neutral density filter or a color filter The individual filters in CFA 300 are grouped into minimal repeating units (MRUs) such as MRU 302, and the MRUs are tiled vertically and horizontally, as indicated by the arrows, to form CFA 300. A minimal repeating unit is a repeating unit such that no other repeating unit has fewer individual filters. A given color filter array can include several different repeating units, but a repeating unit is not a minimal repeating unit if there is another repeating unit in the array that includes fewer individual filters.

FIG. 3B illustrates an embodiment of an MRU 302. MRU 302 is an array of individual filters grouped into rows and columns. MRU 302 includes M columns and N rows, with columns measured by index i and rows measured by index j, so that i ranges from 1 to M and j ranges from 1 to N. In the illustrated embodiment MRU 302 is square, meaning that N=M, but in other embodiments M and N need not be equal. MRU 302 can be divided into four quadrants, with first through fourth quadrants numbered I-IV and arranged counterclockwise starting from the top right: quadrant I in the upper right, quadrant II in the upper left, quadrant III in the lower left, and quadrant IV in the lower right.

FIG. 3C illustrates terminology used below to describe the disclosed MRUs, but the terminology can also be used to describe the color filter array (CFA) as a whole. In a 4×4 MRU (M=N=4) A major diagonal runs from upper left to lower right, whereas a minor diagonal runs from upper right to lower left. The four pixel long diagonal that runs from top left to bottom right is known as the major long diagonal. Above the major long diagonal, the two pixel diagonal that runs from upper left to lower right is known as the upper major short diagonal. Below the major long diagonal, the two pixel diagonal that runs from upper left to lower right is known as the lower major short diagonal. The terminology used for minor diagonals would be similar, as shown in the figure.

Figure 4A:
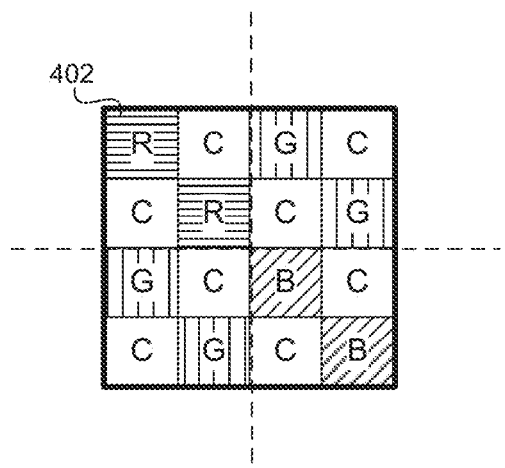
FIGS. 4A-4B are plan view drawings of an embodiment of a minimal repeating unit (FIG. 4A) and a corresponding color filter array (FIG. 4B).
Figure 4B:
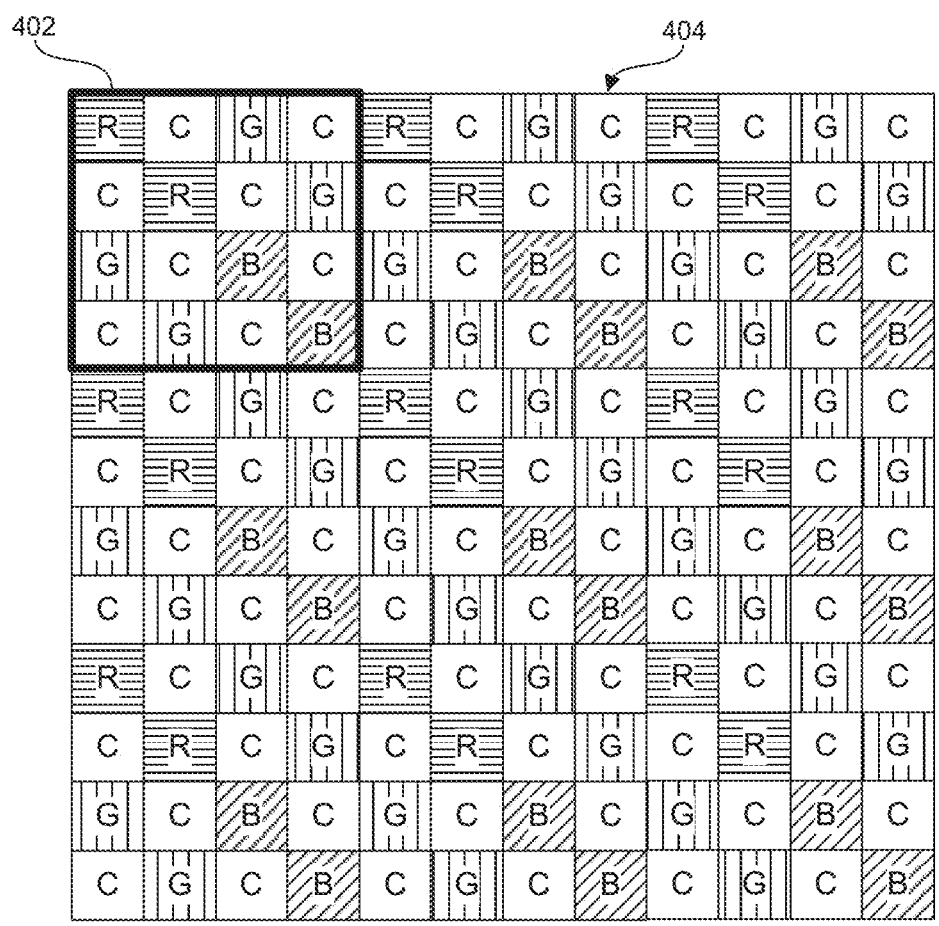

FIGS. 4A-4B illustrate an embodiment of a minimal repeating unit (MRU) 402 and its corresponding color filter array (CFA) 404. Using the terminology of FIG. 3B-3C, FIG. 4A illustrates a sixteen-filter MRU that is 4×4, meaning that it is square with M=N=4. In MRU 402 quadrants I and III have clear filters along their minor diagonals and green filters along their major diagonals. Quadrant II has clear filters along its minor diagonal and red filters along its major diagonal. Finally, quadrant IV has clear filters along its minor diagonal and blue filters along its major diagonal.

FIG. 4B illustrates an embodiment of a CFA 404 formed by tiling MRU 402 as shown in FIG. 3A.

Figure 5:
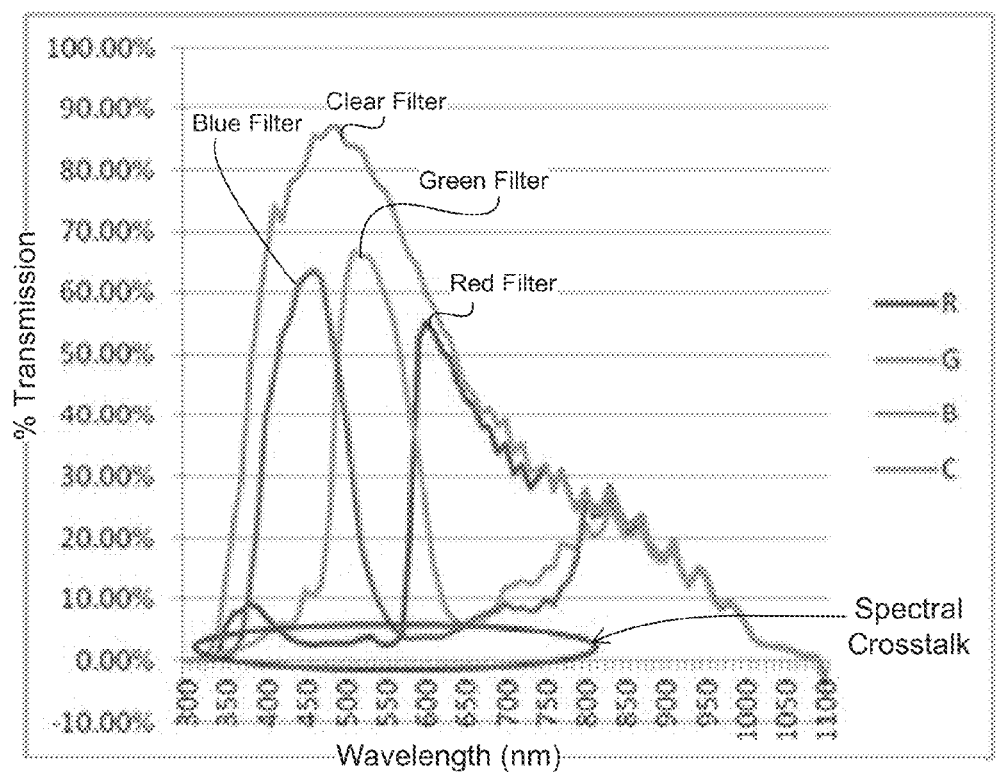
FIG. 5 is a graph illustrating spectral crosstalk in an embodiment of a color filter array.

FIG. 5 illustrates the problem of spectral crosstalk in an embodiment of a red-green-blue-clear (RGBC) color filter array such as CFA 404. In the figure the horizontal axis represents the wavelength of incident light (i.e., its color) while the vertical axis represents the percentage transmission of that particular wavelength. The graph, then, shows what percentage of a particular wavelength of light is transmitted by filter of a particular color.

As an example, when the incident light is at a wavelength of 500-550 nm, which substantially corresponds to green light, the green filter passes nearly 65% of the incident light. Ideally the blue and red filter should pass none of this incident green light because they should filter out all wavelengths that are not blue or red. But as can be seen in the circled portion labeled "spectral crosstalk," at 500-550 nm the blue and red filters nonetheless transmit about 5% of the incident green light. The same is true of the other color filters: looking at the blue filter at an incident wavelength around 400-450 nm, which substantially corresponds to blue light, the blue filter passes about 65% of the incident light at that wavelength. But as can be seen in the circled portion labeled "spectral crosstalk," at 400-450 nm the green and red filters pass about 5% of the incident blue light. This imperfect filtering is a cause of spectral crosstalk. A similar effect happens with green and blue filters at incident wavelengths around 600-650 nm, which substantially corresponds to red light.

Figure 6A:
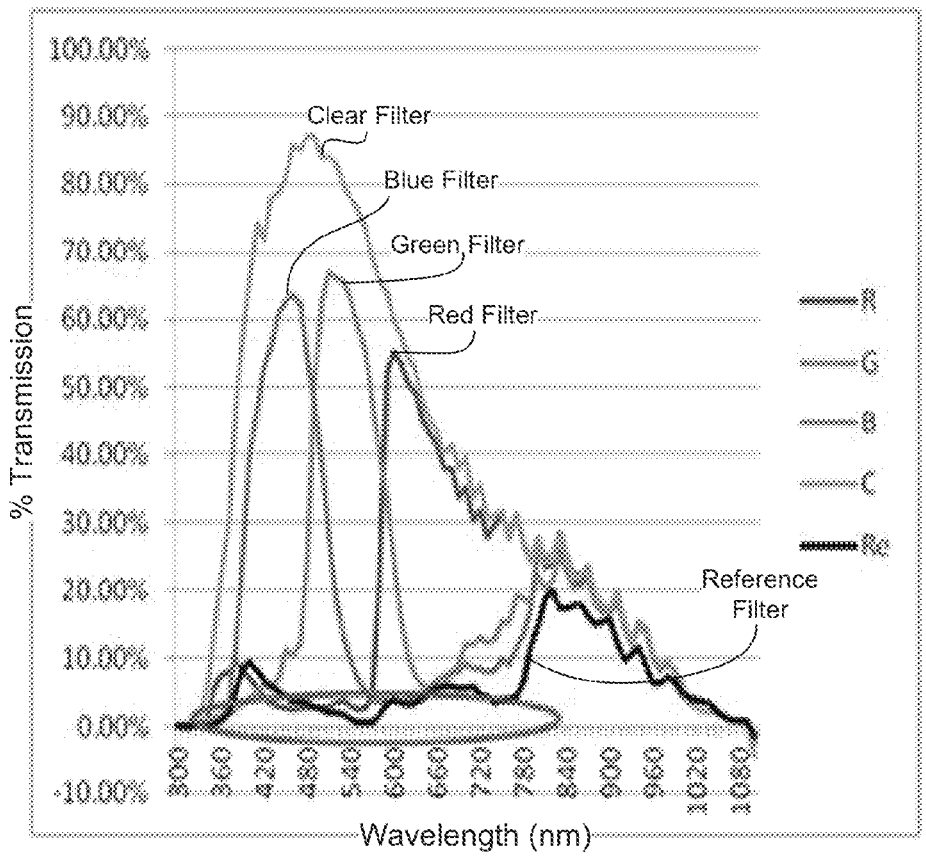
FIGS. 6A-6B are graphs illustrating an embodiment of correcting spectral crosstalk in a color filter array.
Figure 6B:
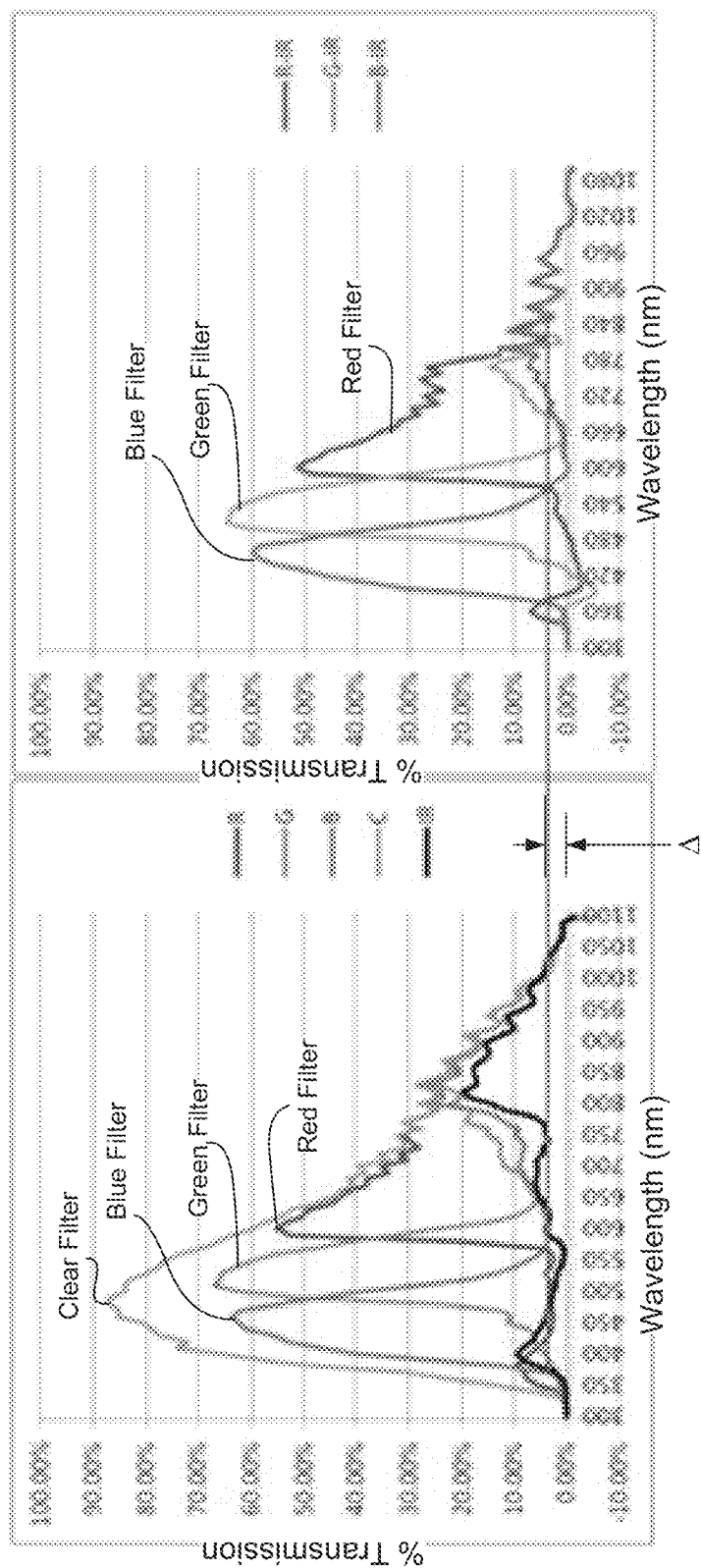

FIGS. 6A-6B are graphs illustrating an embodiment of a process for reducing or eliminating spectral crosstalk. As in FIG. 5, in FIGS. 6A-6B the horizontal axis represents the wavelength of incident light (i.e., its color) while the vertical axis represents the percentage transmission of that particular wavelength. FIGS. 6A-6B, then, show what percentage of light of a particular wavelength is transmitted by filter of a given color. FIG. 6A is a graph illustrating the use of a reference pixel. An embodiment of a solution for optical crosstalk is to use a pixel optically coupled to a reference filter (Re) (together known as a "reference pixel") that transmits the crosstalk spectrum. That is, at any given wavelength of incident light the reference filter Re transmits substantially the same or similar percentage of that wavelength that is unfiltered by filters of a different color than the incident wavelength. As an example, if the incident light is in the wavelength range of 500-550 nm, the Re filter passes around 5% of the incident light, which substantially corresponds to the percentage of incident green light passed by the red and blue filters.

FIG. 6B illustrates an embodiment of how a reference pixel—that is, a pixel optically coupled to a reference filter Re as illustrated in FIG. 6A—can be used to reduce or eliminate spectral crosstalk. The left graph substantially duplicates FIG. 6A, showing the filtering spectrum of reference filter Re, while the right graph shows that the percentage transmission of the reference pixel is subtracted from the red, green, and blue pixels so that the red, green, and blue values are shifted down by an amount $\Delta$. Shifting the red, green, and blue values that substantially reduces or eliminates the spectral crosstalk, as can be seen in the graph on the right. In the illustrated embodiment, $\Delta$ is shown as a single value by which all the red, green, and blue values are shifted downward. But in other embodiments $\Delta$ need not be a single value, but can instead vary by wavelength, such that red, green, and blue values can be shifted down by different $\Delta$s. Other ways of determining $\Delta$s can be used in other embodiments.

Figure 7A:
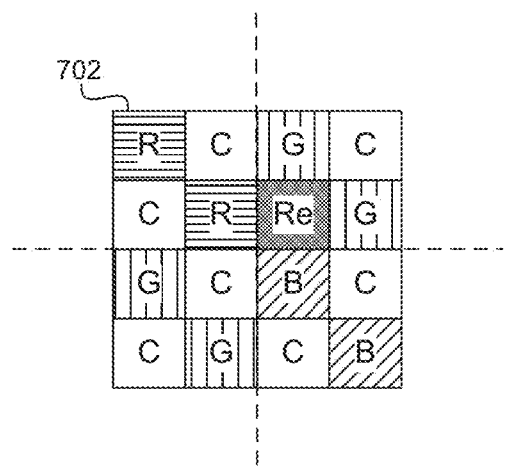
FIGS. 7A-7B are plan view drawings of an embodiment of a minimal repeating unit including a reference pixel (FIG. 7A) and a corresponding color filter array (FIG. 7B).
Figure 7B:
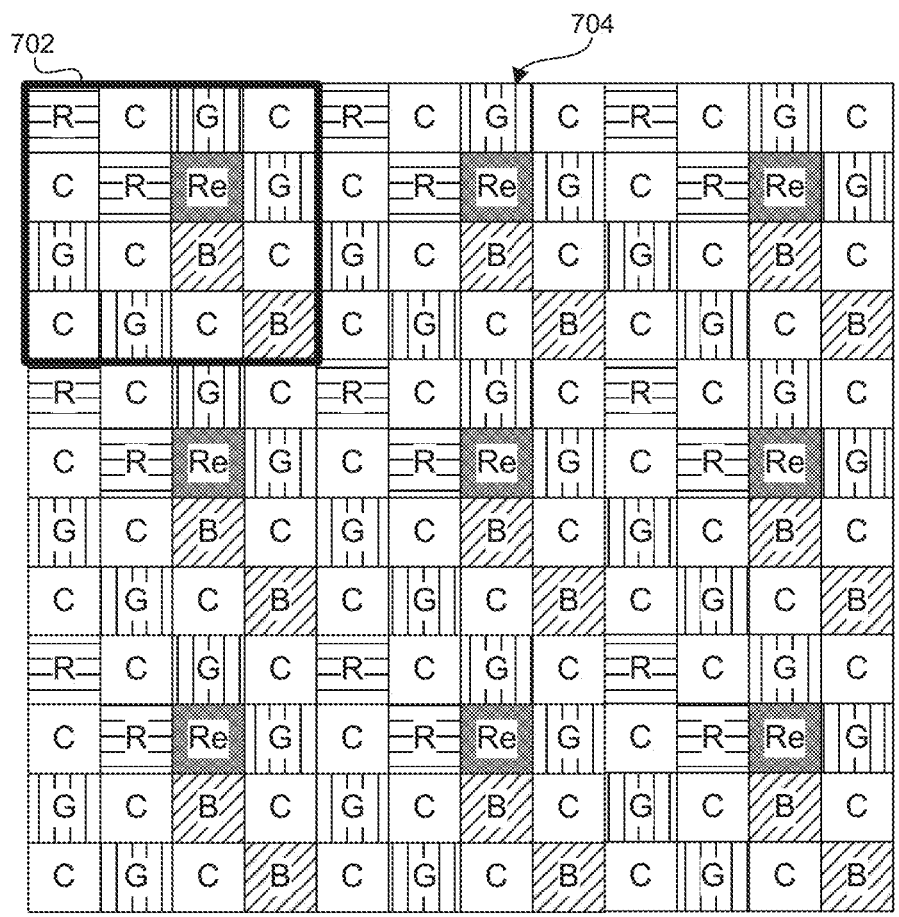

FIGS. 7A-7B illustrate an embodiment of a minimal repeating unit (MRU) 702 that includes a reference filter (Re), as well as a corresponding color filter array (CFA) 704. Again using the terminology of FIGS. 3A-3C, FIG. 7A illustrates a 16-filter MRU 702 that is 4×4, meaning that it is square with M=N=4. MRU 702 is similar to MRU 302: quadrant II has clear filters along its minor diagonal and red filters along its major diagonal; quadrant III has clear filters along its minor diagonal and green filters along its major diagonal; and quadrant IV has clear filters along its minor diagonal and blue filters along its major diagonal. The primary difference between MRUs 302 and 702 is that quadrant I replaces one of the clear filters with a reference filter Re, so that quadrant I has a clear filter and a reference filter along its minor diagonal and green filters along its major diagonal. FIG. 7B illustrates an embodiment of a CFA 704 formed by tiling MRU 702 as shown in FIG. 3A.

Figure 8A:
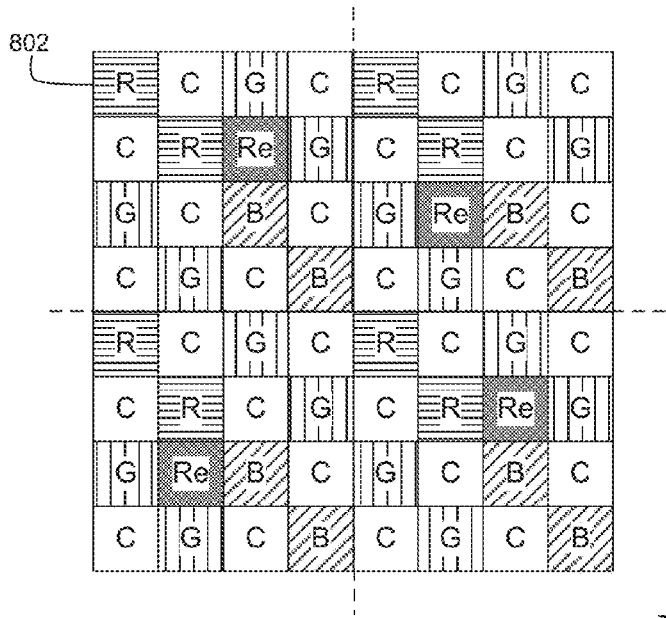
FIGS. 8A-8B are plan view drawings of an embodiment of a minimal repeating unit including a reference pixel (FIG. 8A) and a corresponding color filter array (FIG. 8B).
Figure 8B:
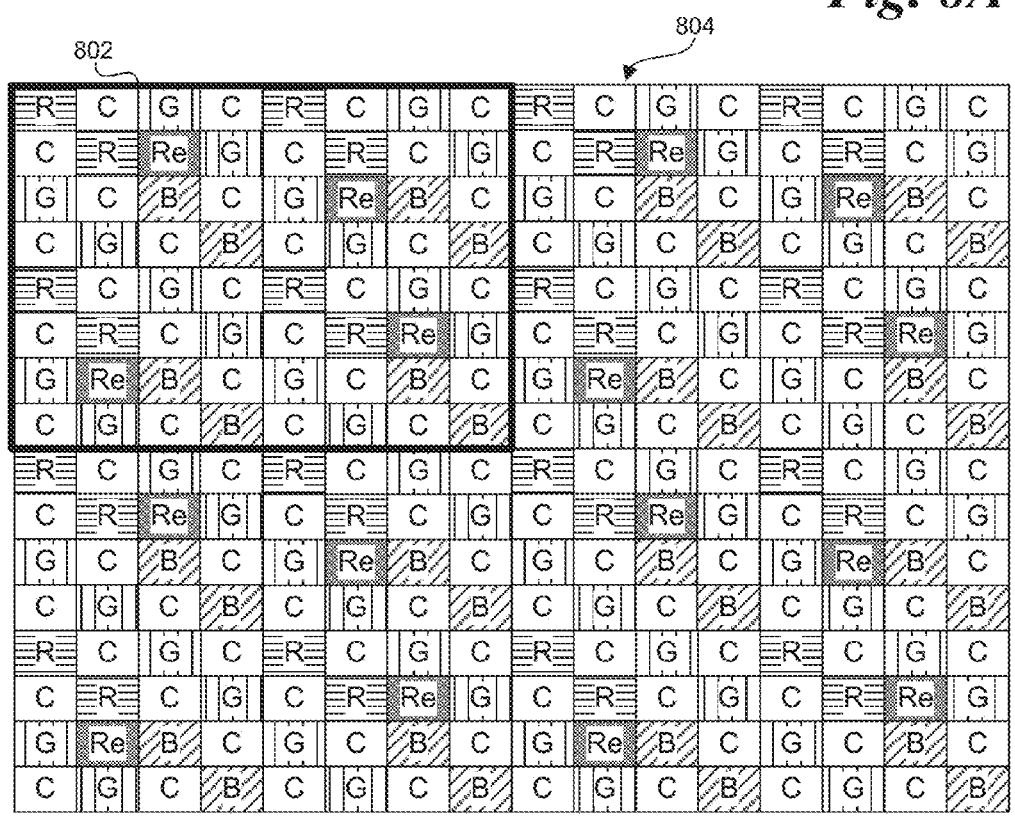

FIGS. 8A-8B illustrate another embodiment of a minimal repeating unit (MRU) 802 that includes a reference filter (Re), as well as a corresponding color filter array (CFA) 804. FIG. 8A illustrates a 64-filter MRU that is 8×8, meaning that MRU 802 is square with M=N=8. In MRU 802, quadrants I-IV have two red and two blue filters along their major diagonal. Quadrants I and III have clear filters on their minor diagonals, except for a reference filter positioned on the minor diagonal along the lower major short diagonal. Quadrants II and IV have clear filters on their minor diagonal, except for a reference filter positioned on the minor diagonal along the upper major short diagonal. FIG. 8B illustrates an embodiment of a CFA 804 formed by tiling MRU 802 as shown in FIG. 3A.

Figure 9A:
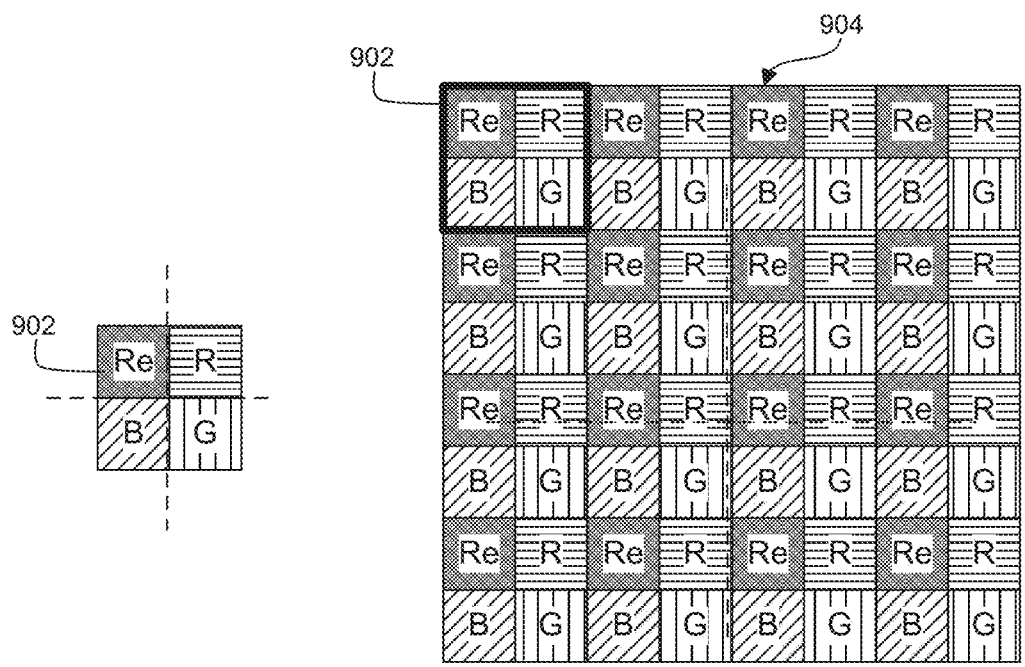
FIG. 9A is a plan view drawing of an embodiment of a red-green-blue (RGB) minimal repeating unit including a reference pixel and a corresponding color filter array.
Figure 9B:
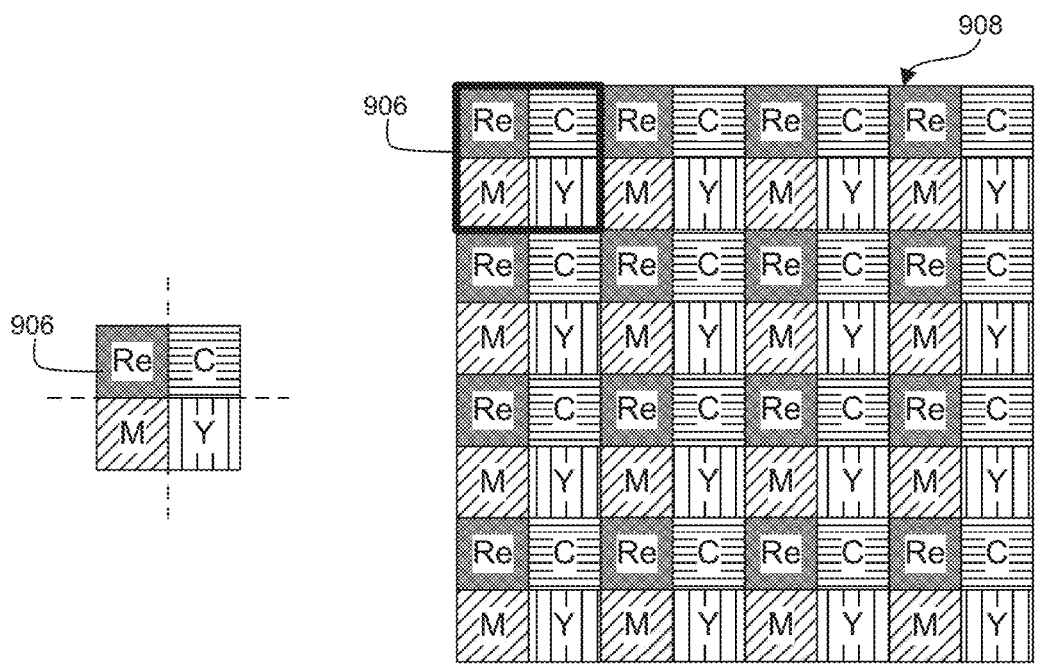
FIG. 9B is a plan view drawing of an embodiment of a cyan-magenta-yellow (CMY) minimal repeating unit including a reference pixel and a corresponding color filter array.

FIGS. 9A-9B illustrate other embodiments of MRUs, and their corresponding CFAs, that include reference filters. All the preceding MRU and CFA embodiments are RGBC patterns—they all include red, green, blue, and clear filters—but in other embodiments that need not be the case. FIG. 9A illustrates another MRU 902 that is an RGB pattern (i.e., it includes no clear pixel), but nonetheless includes a reference pixel. MRU 902 has four filter and is 2×2, meaning that it is square with M=N=2. MRU 902 has a reference filter and a green filter along its major diagonal and blue and red filters along its minor diagonal. MRU 902 is the well-known Bayer filter pattern, but with one green filter replaced with a reference filter. In the illustrated embodiment, a green filter is replaced with a reference filter because a Bayer pattern normally includes two green filters, so that replacing one green still leaves another in the pattern. But this need not be the case in every embodiment. In other embodiments, for example, the filter color that most closely approximates the luminance component of the image can be replaced with a reference pixel. The right side of the figure illustrates a CFA 904 formed by tiling MRU 902 as shown in FIG. 3A.

FIG. 9B illustrates another MRU 906 that is a cyan-magenta-yellow (CMY) pattern (i.e., it includes no clear pixel), but nonetheless includes a reference pixel. MRU 906 is 2×2, meaning that it is square with M=N=2. MRU 906 has a reference filter and a yellow filter along its major diagonal and cyan and magenta filters along its minor diagonal. MRU 906 is similar to MRU 902, but with a different primary color set: the RGB color set of MRU 902 has been replaced with a CMY primary color set, and with one of the yellow filters replaced by a reference filter. In the illustrated embodiment, a yellow filter is replaced with a reference filter because there would usually be two yellow filters in the pattern, so replacing one yellow still leaves another in the pattern. But in other embodiments the filter color that most closely approximates the luminance component of the image can be replaced with the reference pixel. The right side of the figure illustrates a CFA 908 formed by tiling MRU 906 as shown in FIG. 3A.

Figure 10:
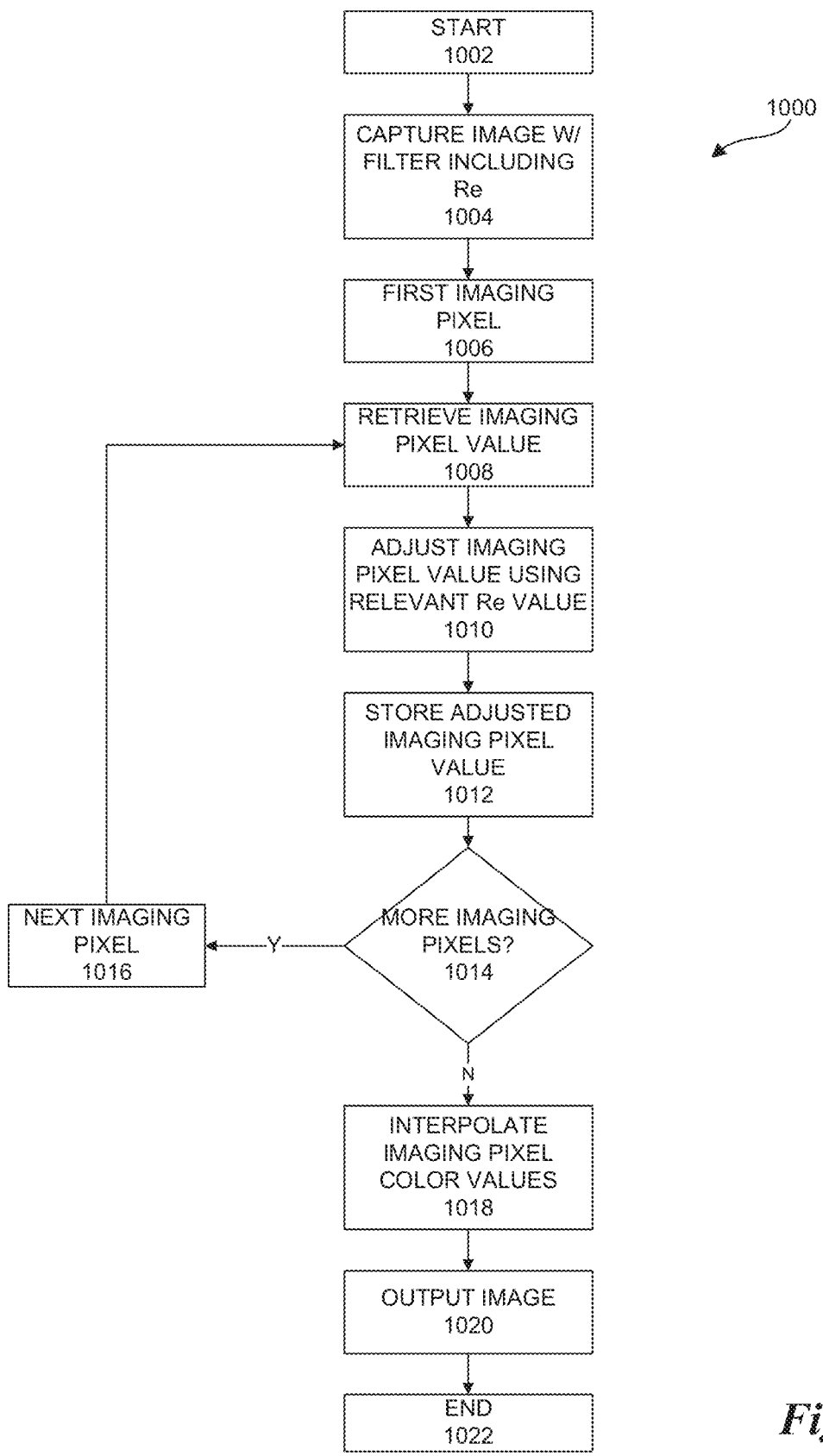
FIG. 10 is a flowchart of an embodiment of a process for correcting images to account for spectral crosstalk.

FIG. 10 illustrates an embodiment of a process 1000 for correcting spectral crosstalk in an image. The process starts at block 1002. At block 1004 the process captures an image using a pixel array optically coupled to a color filter array with a reference filter, such as any of the color filter arrays shown in preceding figures. The pixel array can be thought of as composed of two types of pixels: imaging pixels (e.g., pixels coupled to R, G, B, C filters) that generate imaging pixel values on which the final image will be based, and reference pixels that generate reference pixel values. Initially, each pixel in the pixel array will generate a single pixel value that is either imaging pixel value or a reference pixel value depending on what type of pixel it is.

At block 1006, the first imaging pixel is selected for processing. At block 1008 the imaging pixel value for the selected pixel is retrieved, and at block 1010 the imaging pixel value is adjusted using the relevant reference pixel value. In one embodiment the imaging pixel value is adjusted by simply subtracting the reference pixel value of the reference pixel closest to the imaging pixel whose value is being processed. The closest reference pixel need not be within the same MRU as the imaging pixel being processed. In another embodiment, a correction Δ can be computed based on two or more of the closest reference pixels to the imaging pixel whose imaging pixel value is being adjusted—for example the 2, 3, 4, etc., closest reference pixels. For example, in one embodiment Δ could be a weighted average of the nearest reference pixel values. Different embodiments can weight the reference pixel values differently; in one embodiment, for example, the reference pixel values can be weighted based on distance from the imaging pixel being corrected and intensity.

At block 1012, the adjusted imaging pixel value is stored, after which the process continues to block 1014 and checks to see if more imaging pixels remain to be processed. If at block 1014 more imaging pixels remain to be processed, the process continues to block 1016 where it selects the next imaging pixel and then returns to block 1008 and repeats the process for the newly-selected imaging pixel. If at block 1014 no imaging pixels remain to be processed, meaning that all imaging pixel values in the image have been adjusted, the process continues to block 1018. At block 1018, color values are interpolated for all imaging pixels to form a final image, so that in the final image all pixels will have a set of three imaging pixel values corresponding to a primary color set (e.g., red, green, and blue in an RGB or RGBC). After imaging pixel values are interpolated for the imaging pixels, the image is output at block 1020 and the process ends at block 1022.

The above description of illustrated embodiments of the invention, including what is described in the abstract, is not intended to be exhaustive or to limit the invention to the exact forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be interpreted to limit the invention to the specific embodiments disclosed in the specification and the claims. Rather, the scope of the invention is to be determined entirely by the following claims, which are to be interpreted in accordance with established doctrines of claim interpretation.

The invention claimed is:

1. A color filter array comprising:

a plurality of tiled minimal repeating units, each minimal repeating unit comprising an M×N set of individual filters, wherein each minimal repeating unit includes:

a plurality of imaging filters including individual filters having at least first, second, third, and fourth photoresponses; and at least one reference filter having a reference photoresponse, wherein the reference filter is positioned among the imaging filters and wherein the reference photoresponse transmits substantially the crosstalk spectrum that is not filtered from light incident on the color filter array by the plurality of imaging filters;

wherein the first photoresponse is panchromatic (C), the second photoresponse is red (R), the third photoresponse is green (G), and the fourth photoresponse is blue (B), and wherein the minimal repeating unit is selected from a group consisting of a minimal repeating unit wherein M=N=4 and the minimal repeating unit is:

| R | C | G | C |
| C | R | Re | G |
| G | C | B | C |
| C | G | C | B | and a minimal repeating unit wherein M=N=8 and the minimal repeating unit is:

| R | C | G | C | R | C | G | C |
| C | R | Re | G | C | R | C | G |
| G | C | B | C | G | Re | B | C |
| C | G | C | B | C | G | C | B |
| R | C | G | C | R | C | G | C |
| C | R | C | G | C | R | Re | G |
| G | Re | B | C | G | C | B | C |
| C | G | C | B | C | G | C | B | wherein Re represents a filter with the reference photoresponse.

2. A color filter array comprising:

a plurality of tiled minimal repeating units, each minimal repeating unit comprising an M×N set of individual filters, wherein each minimal repeating unit includes:

a plurality of imaging filters including individual filters having at least first, second, and third photoresponses; and at least one reference filter having a reference photoresponse, wherein the reference filter is positioned among the imaging filters and wherein the reference photoresponse transmits substantially the crosstalk spectrum that is not filtered from light incident on the color filter array by the plurality of imaging filters;

wherein the first photoresponse is red (R), the second photoresponse is green (G), and the third photoresponse is blue (B), and wherein M=N=2 and the minimal repeating unit is:

| Re | R |
| B | G | wherein Re represents a filter with the reference photoresponse.

3. An image sensor comprising:
a pixel array including a plurality of individual pixels;
a color filter array positioned over and optically coupled to the pixel array, the color filter array comprising a plurality of tiled minimal repeating units, each minimal repeating unit comprising an M×N set of individual filters, wherein each minimal repeating unit includes:
   a plurality of imaging filters including individual filters having at least first, second, third, and fourth photoresponses, and
   at least one reference filter having a reference photoresponse, wherein the reference filter is positioned among the imaging filters and wherein the reference photoresponse transmits substantially only the crosstalk spectrum that is not filtered from light incident on the color filter array by the plurality of imaging filters;
wherein the first photoresponse is panchromatic (C), the second photoresponse is red (R), the third photoresponse is green (G), and the fourth photoresponse is blue (B), wherein the minimal repeating unit is selected from a group consisting of a minimal repeating unit wherein M=N=4 and the minimal repeating unit is:

| R | C | G | C |
|---|---|---|---|
| C | R | Re | G |
| G | C | B | C |
| C | G | C | B | and a minimal repeating unit wherein M=N=8 and the minimal repeating unit is:

| R | C | G | C | R | C | G | C |
|---|---|---|---|---|---|---|---|
| C | R | Re | G | C | R | C | G |
| G | C | B | C | G | Re | B | C |
| C | G | C | B | C | G | C | B |
| R | C | G | C | R | C | G | C |
| C | R | C | G | C | R | Re | G |
| G | Re | B | C | G | C | B | C |
| C | G | C | B | C | G | C | B | wherein Re represents a filter with the reference photoresponse; and
readout circuitry coupled to the pixel array to read out signals from the individual pixels.

4. An image sensor comprising:
a pixel array including a plurality of individual pixels;
a color filter array positioned over and optically coupled to the pixel array, the color filter array comprising a plurality of tiled minimal repeating units, each minimal repeating unit comprising an M×N set of individual filters, wherein each minimal repeating unit includes:
   a plurality of imaging filters including individual filters having at least first, second, and third photoresponses, and
   at least one reference filter having a reference photoresponse, wherein the reference filter is positioned among the imaging filters and wherein the reference photoresponse transmits substantially only the crosstalk spectrum that is not filtered from light incident on the color filter array by the plurality of imaging filters;
wherein the first photoresponse is red (R), the second photoresponse is green (G), and the third photoresponse is blue (B), and wherein M=N=2 and the minimal repeating unit is:

| Re | R |
|----|---|
| B  | G | wherein Re represents a filter with the reference photoresponse; and
readout circuitry coupled to the pixel array to read out signals from the individual pixels.

5. A process comprising:
capturing an image comprising a plurality of imaging pixel values and a plurality of reference pixel values using a pixel array including a plurality of individual pixels and optically coupled to a color filter array positioned over the pixel array, the color filter array comprising a plurality of tiled minimal repeating units, each minimal repeating unit comprising an M×N set of individual filters, wherein each minimal repeating unit includes:
   a plurality of imaging filters, each imaging filter coupled to an imaging pixel, wherein the plurality of imaging filters includes individual filters having at least first, second, third, and fourth photoresponses, and
   at least one reference filter optically coupled to a reference pixel, the reference filter having a reference photoresponse, wherein the reference filter is positioned among the imaging filters and wherein the reference photoresponse transmits substantially only the crosstalk spectrum that is not filtered from light incident on the color filter array by the plurality of imaging filters;
wherein the first photoresponse is panchromatic (C), the second photoresponse is red (R), the third photoresponse is green (G), and the fourth photoresponse is blue (B), and wherein the minimal repeating unit is selected from a group consisting of a minimal repeating unit wherein M=N=4 and the minimal repeating unit is:

| R | C | G | C |
|---|---|---|---|
| C | R | Re | G |
| G | C | B | C |
| C | G | C | B | and a minimal repeating unit wherein M=N=8 and the minimal repeating unit is:

| R | C | G | C | R | C | G | C |
|---|---|---|---|---|---|---|---|
| C | R | Re | G | C | R | C | G |
| G | C | B | C | G | Re | B | C |
| C | G | C | B | C | G | C | B |
| R | C | G | C | R | C | G | C |
| C | R | C | G | C | R | Re | G |
| G | Re | B | C | G | C | B | C |
| C | G | C | B | C | G | C | B | wherein Re represents a filter with the reference photoresponse; and
adjusting imaging pixel values based on one or more reference pixel values to reduce or remove spectral crosstalk from the imaging pixel values.

6. The process of claim 5 wherein the one or more reference pixel values need not be from reference pixels within the same minimal repeating unit.

7. The process of claim 5 wherein adjusting the values of the imaging pixels to reduce or remove spectral crosstalk comprises, for each imaging pixel, subtracting the reference pixel value of the nearest reference pixel.

8. A process comprising:
capturing an image comprising a plurality of imaging pixel values and a plurality of reference pixel values using a pixel array including a plurality of individual pixels and optically coupled to a color filter array positioned over the pixel array, the color filter array comprising a plurality of tiled minimal repeating units, each minimal repeating unit comprising an M×N set of individual filters, wherein each minimal repeating unit includes:
a plurality of imaging filters, each imaging filter coupled to an imaging pixel, wherein the plurality of imaging filters includes individual filters having at least first, second, and third photoresponses, and
at least one reference filter optically coupled to a reference pixel, the reference filter having a reference photoresponse, wherein the reference filter is positioned among the imaging filters and wherein the reference photoresponse transmits substantially only the crosstalk spectrum that is not filtered from light incident on the color filter array by the plurality of imaging filters;
wherein the first photoresponse is red (R), the second photoresponse is green (G), and the third photoresponse is blue (B) and wherein M=N=2 and the minimal repeating unit is:

| Re | R |
|----|---|
| B  | G | wherein Re represents a filter with the reference photoresponse; and
adjusting imaging pixel values based on one or more reference pixel values to reduce or remove spectral crosstalk from the imaging pixel values.

9. The process of claim 8 wherein adjusting the values of the imaging pixels to reduce or remove spectral crosstalk comprises, for each imaging pixel, subtracting the reference pixel value of the nearest reference pixel.

10. The process of claim 8 wherein the one or more reference pixel values need not be from reference pixels within the same minimal repeating unit.

11. A process comprising:
capturing an image comprising a plurality of imaging pixel values and a plurality of reference pixel values using a pixel array including a plurality of individual pixels and optically coupled to a color filter array positioned over the pixel array, the color filter array comprising a plurality of tiled minimal repeating units, each minimal repeating unit comprising an M×N set of individual filters, wherein each minimal repeating unit includes:
a plurality of imaging filters, each imaging filter coupled to an imaging pixel, wherein the plurality of imaging filters includes individual filters having at least first, second, and third photoresponses, and
at least one reference filter optically coupled to a reference pixel, the reference filter having a reference photoresponse, wherein the reference filter is positioned among the imaging filters and wherein the reference photoresponse transmits substantially only the crosstalk spectrum that is not filtered from light incident on the color filter array by the plurality of imaging filters;
adjusting imaging pixel values based on one or more reference pixel values to reduce or remove spectral crosstalk from the imaging pixel values, wherein adjusting the values of the imaging pixels to reduce or remove spectral crosstalk comprises, for each imaging pixel, subtracting from the imaging pixel value a weighted average reference pixel values of two or more of the nearest reference pixels.

* * * * *